United States Patent [19]

Marita et al.

[11] 4,186,345
[45] Jan. 29, 1980

[54] REMOTE CONTROL SYSTEM

[75] Inventors: Kouji Marita, Kodaira; Takao Mogi, Tokyo, both of Japan

[73] Assignee: Sony Corporation, Tokyo, Japan

[21] Appl. No.: 846,445

[22] Filed: Oct. 28, 1977

[30] Foreign Application Priority Data

Nov. 5, 1976 [JP] Japan ................. 51-133520

[51] Int. Cl.² ........................................... H01R 13/50
[52] U.S. Cl. ................... 325/37; 340/167 A; 340/168 R
[58] Field of Search ............. 179/15 AW; 340/167 R, 340/167 A, 5 R, 168 R, 168 B, 168 CC, 168 S; 343/225; 325/37; 328/122

[56] References Cited

U.S. PATENT DOCUMENTS

| 3,678,392 | 7/1972 | Houghton | 325/392 |
| 3,711,756 | 1/1973 | Ogiso | 340/167 A |
| 3,835,454 | 9/1974 | Palmieri | 343/225 |
| 3,858,116 | 12/1974 | Friedl et al. | 340/167 A |
| 3,944,982 | 3/1976 | Mogi et al. | 340/171 R |

Primary Examiner—Benedict V. Safourek
Attorney, Agent, or Firm—Lewis H. Eslinger; Alvin Sinderbrand

[57] ABSTRACT

A remote control system for selectively controlling a plurality of functions includes a receiver having a decoding circuit for decoding a command signal having alternating mark periods and space periods, the decoding circuit being responsive to the length of the space period for selecting the function to be controlled.

7 Claims, 5 Drawing Figures

REMOTE CONTROL SYSTEM

BACKGROUND OF THE INVENTION

1. Field of the Invention

This invention relates generally to a remote control system for controlling a plurality of functions such as channel selection, sound adjustment, luminance adjustment and so on of a television receiver or the like, and is directed more particularly to a system using a command signal including a series of alternating mark periods and space periods.

2. Description of the Prior Art

In the art, a remote control system for a television receiver or the like is known which uses an ultrasonic wave signal of, for example, 40 KHz. In such a system, when the ultrasonic wave signal is supplied once, the channel of the television receiver is switched, for example, by one. If the channel selection is controlled only by detecting whether the ultrasonic wave signal is present or not, it is very easy for erroneous operation to be caused by noise.

In order to avoid this erroneous operation one known system uses an ultrasonic wave signal transmitted intermittently at a predetermined frequency. The signal has a mark period and space period which are repeated. In the receiver, a control signal is produced only when an ultrasonic wave signal having a predetermined mark period is received repeatedly a predetermined number of times. Thus, erroneous operation caused by noise can be avoided.

It is also desirable that, in addition to channel selection, the same remote control system be used for the adjustment of sound volume and luminance. To this end, it is necessary to have a system capable of transmitting the number of instructions corresponding to the number of functions to be controlled. Therefore, it is known to control the intermittent frequency in response to the function selected, and, at the receiving end, to detect successive periods (mark periods) of the ultrasonic wave signal to carry out the various operations in accordance with the detected length of successive period (mark periods).

However, with the above multi-function system it is possible for a noise signal occurring within the space period to be detected and thereby cause the system to operate erroneously. To avoid this it has been suggested to only consider the ultrasonic wave signal present when it is detected continuously for more than 30 msec (milli-seconds) and when the signal is present less than 30 m sec it is considered to be noise.

In the above case, however, if the tolerance error for detecting the successive time periods (mark periods) is selected as, for example, $\pm 10\%$ and if a signal having a predetermined period is detected repeatedly four times to produce an output signal (control signal), the time necessary for detection is shown in the following table I in which $A_1$, $A_2$, $A_3$, $A_4$ and $A_5$ represent control signals or command signals.

Table I

| Mark Period $-10\% \sim t_1 + 10\%$ (m sec) | Space period $t_2(=t_1)$ (m sec) | Minimum Detecting Period $t_1 \times 4 + t_2 \times 3$ (m sec) |
|---|---|---|
| $A_1$ 30.6 ~ 34 ~ 37.4 | 34 | 238 |
| $A_2$ 37.8 ~ 42 ~ 46.2 | 42 | 294 |
| $A_3$ 46.8 ~ 52 ~ 57.2 | 52 | 364 |
| $A_4$ 57.6 ~ 64 ~ 70.4 | 64 | 448 |

Table I-continued

| Mark Period $-10\% \sim t_1 + 10\%$ (m sec) | Space period $t_2(=t_1)$ (m sec) | Minimum Detecting Period $t_1 \times 4 + t_2 \times 3$ (m sec) |
|---|---|---|
| $A_5$ 71.1 ~ 79 ~ 86.9 | 79 | 553 |

In the Table I, $t_1$ represents the mark period and $t_2$ the space period, respectively.

It is demonstrated from the above Table I that to control more than five functions with the above system could require more than 0.5 seconds to convey a command.

OBJECTS AND SUMMARY OF THE INVENTION

Accordingly, it is an object of the present invention to provide a remote control system suitable for use with an electric apparatus, such as a television receiver, to control a multiplicity of functions, such as channel selection and sound and luminance adjustments and so on.

Another object of the present invention is to provide a remote control system in which any one of a number of different commands can be transmitted in a short period of time.

A further object of the present invention is to provide a remote control system with which erroneous operation caused by noise is reduced.

A still further object of the present invention is to provide a remote control system in which the battery life span for a remote transmitter is prolonged.

According to an aspect of this invention there is provided a remote control system for selectively controlling a plurality of functions of an electric apparatus which includes a receiver for decoding a repetitive command signal having a mark period and a space period to control the electric apparatus in response to the length of said space periods. One embodiment includes a space period detector, a pulse generator for generating pulses at a predetermined rate during the detected space period of the command signal, a first counter for counting the pulses to activate only a selected one of a plurality of different outputs in response to different pulse counts, a plurality of second counters, each being triggered by the selected outputs and providing an output signal when a predetermined number of output pulses are counted, and a plurality of memories, each being triggered by each output of the second counters and controlling a different one of the functions of the electric apparatus.

The other objects, features and advantages of the present invention will become apparent from the following description taken in conjunction with the accompanying drawings.

BRIEF DESCRIPTION OF THE DRAWING

FIGS. 3A and 3B are waveform diagrams used for explaining the operation of the embodiment of FIG. 2.

DESCRIPTION OF THE PREFERRED EMBODIMENTS

Figure 1:
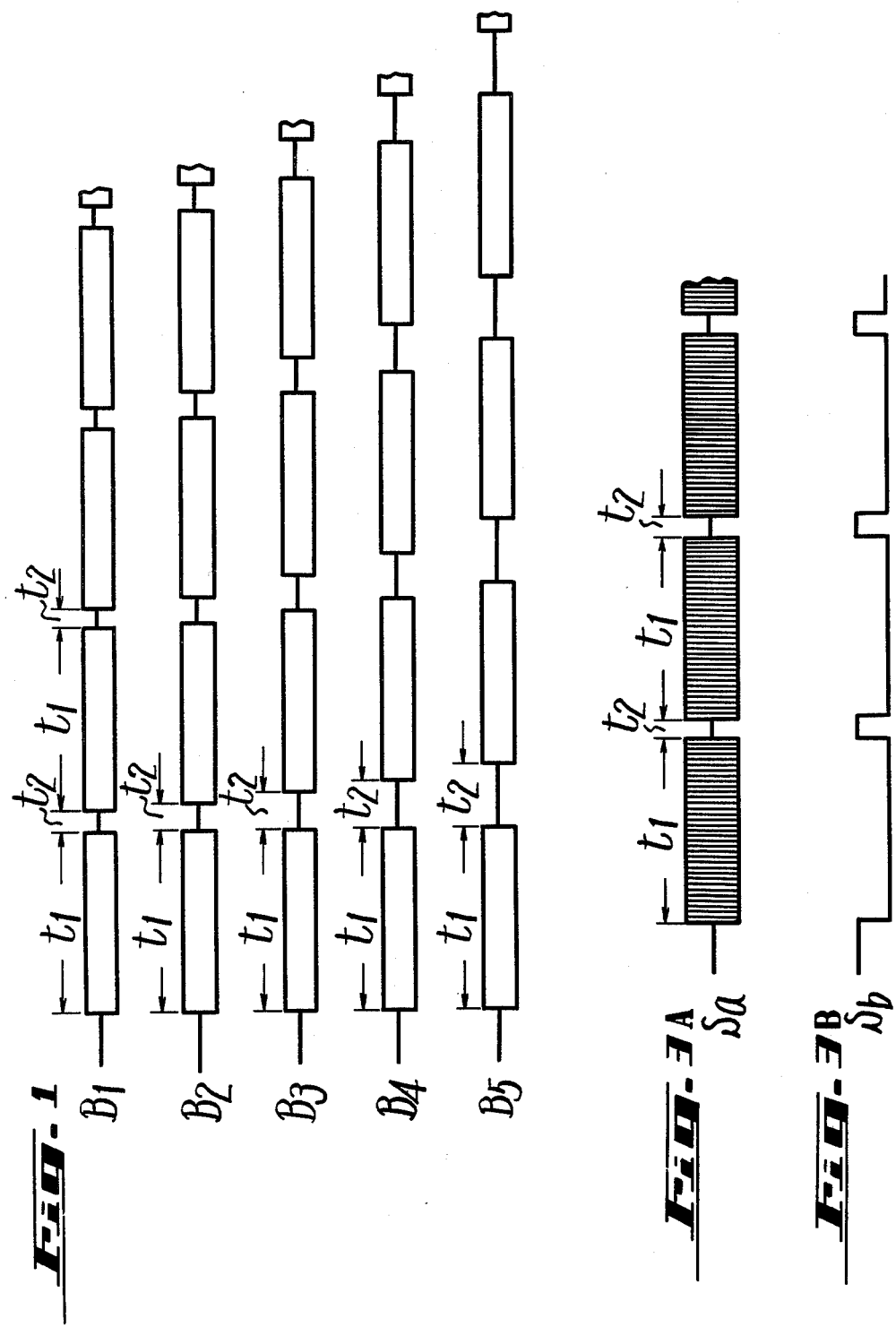
FIG. 1 is a waveform diagram used for the explanation of the operations of the present invention.

First, a command signal, such as an ultrasonic wave signal, used in the present invention for transmitting instructions will be described with reference to FIG. 1. As shown in FIG. 1, a space period $t_2$ of the command signals $B_1$, $B_2$, $B_3$, $B_4$ and $B_5$ is controlled to transmit the desired instructions. If the command signal is controlled as previously described, a mark period $t_1$ of the command signal need only be long enough to make the command signal distinguishable from noise. Therefore, it is sufficient if the mark period chosen to be is 34 m sec or longer. Further, since the discrimination of the command signal from noise is carried out within the mark period $t_1$ as set forth above, the space period $t_2$, which is varied in width in response to the selected function, can be very short. Even when considering the response characteristics of a circuit, the space period $t_2$ can be as small as 3 m sec. Accordingly, even in the case where the command signal is transmitted repeatedly, the time period required for a complete transmission can be relatively short.

If the tolerance error of the successive time periods (mark periods) is taken as ±10% as in the prior art and an output signal is produced when four of command signals are received repeatedly, the minimum period required for detection is shown by the following table II.

Table II

| Mark Period $t_1(=34$ m sec) | Space Period $-10 \sim t_2 \sim +10\%$ | Minimum Detecting Period $t_1 \times 4 + t_2 \times 4$ (m sec) |
|---|---|---|
| $B_1$ 34 | 3.6 ~ 4 ~ 4.4 | 152 |
| $B_2$ 34 | 4.5 ~ 5 ~ 5.5 | 156 |
| $B_3$ 34 | 6.3 ~ 7 ~ 7.7 | 164 |
| $B_4$ 34 | 8.1 ~ 9 ~ 9.9 | 172 |
| $B_5$ 34 | 10.8 ~ 12 ~ 13.2 | 184 |

As may be apparent from the above Table II, even when controlling five different functions, the detecting time period required is shorter than 0.2 sec. and hence the control can be carried out with less delay.

In this case, since the time period for transmitter operation is shortened, the life span of a battery powering rhw transmitter can be prolonged.

Further, as the space period $t_2$ is short relative to the total signal period, even if a noise signal occurs there is only a low probability that the occurrence time of the noise signal will coincide with the space period $t_2$. Thus, the probability of erroneous operation due to noise signals is reduced further.

Figure 2:
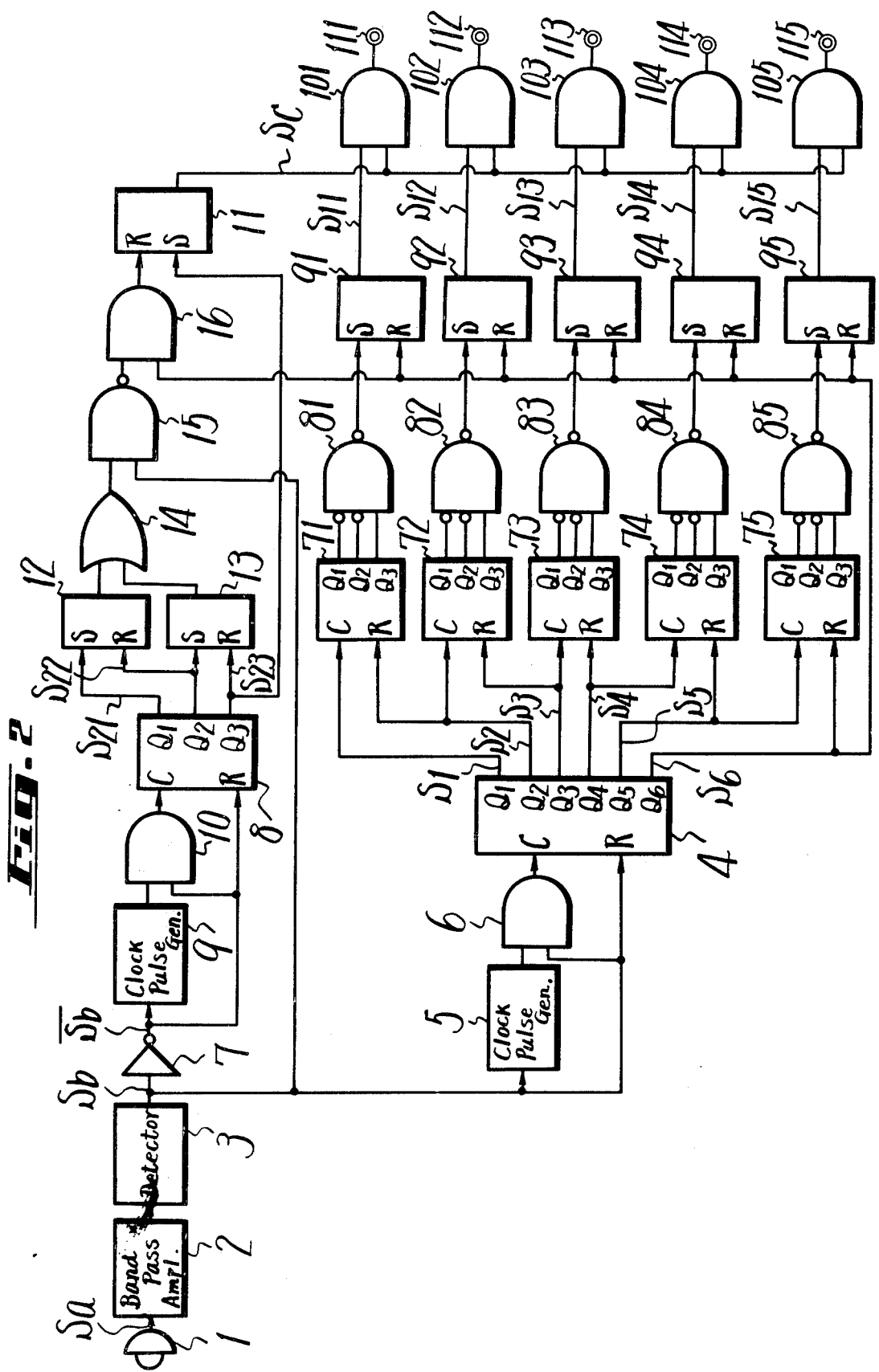
FIG. 2 is a schematic block diagram of one embodiment of the present invention.

FIG. 2 shows a receiver circuit including one embodiment of the present invention capable of receiving the above command signal.

In FIG. 2, a microphone 1 for receiving a command signal such as an ultrasonic wave signal is connected to a band pass amplifier 2 which amplifies a predetermined frequency band at a center frequency of, for example, 40 KHz. A detector 3 is connected to the amplifier 2 and envelope-detects the output signal of band pass amplifier 2.

When the command signal such as a signal Sa shown in FIG. 3A is applied from the microphone 1 to the detector 3 through the band pass amplifier 2, the detector 3 produces an output signal Sb shown in FIG. 3B. This output signal $S_b$ is fed to a ring counter 4 at its reset terminal R and also to a clock pulse generator 5. The signal $S_b$ from the detector 3 and the clock pulse from the clock pulse generator 5 are fed through an AND-circuit 6 to the ring-counter 4 at its clock terminal C. Thus, the counter 4 produces, at its respective output terminals $Q_1$, $Q_2$, $Q_3$, $Q_4$ and $Q_5$, signals $S_1$, $S_2$, $S_3$, $S_4$ and $S_5$ which become "1" successively in response to the space period $t_2$ having a time period as shown in the Table II. The output terminal $Q_6$ produces a signal $S_6$ when the space period $t_2$ exceeds the predetermined maximum time period. The signals $S_1$ to $S_5$ are fed to the clock terminals C of three bit binary counters 71 to 75, respectively. The signals $S_2$ to $S_5$ are fed to the reset terminals R of the counters 71 to 75, respectively.

The output signals from the counters 71 to 75 are fed to decoders 81 to 85, respectively, which produce output signals of the level "0" when the contents of the respective counter 71 to 75 becomes "4". Thus, when the signal $S_a$ of a predetermined time period shown in the Table II is repeatedly fed from the microphone 1 to the detector 3 four times, the decoders 81 to 85 produce output signals of "0" in response thereto. The output signals from the decoders 81 to 85 are fed to the set terminals S of flip-flop circuits 91 to 95, respectively, which are supplied at their reset terminals R with the signal $S_6$ from the ring counter 4. The output signals $S_{11}$, $S_{12}$, $S_{13}$, $S_{14}$ and $S_{15}$ from the flip-flop circuits 91 to 95 are delivered through AND gate circuits 101 to 105 to output terminals 111 to 115, respectively.

The signal $S_b$ from the detector 3 is fed to an inverter 7 and becomes the signal $\overline{S_b}$ which is fed to the reset terminal R of a ring counter 8 and also to a clock pulse generator 9 having a period of 15 m sec. The clock pulse from the clock pulse generator 9 and the signal $\overline{S_b}$ from the inverter 7 are fed through an AND circuit 10 to the clock terminal C of the counter 8. Thus, the counter 8 produces at its output terminal $Q_3$ a signal $S_{23}$ in response to the mark period $t_1$ when the mark period $t_1$ is present for 30 m sec. This signal $S_{23}$ is fed to the set terminal S of a flip-flop circuit 11. An output signal $S_c$ from the flip-flop circuit 11 is applied to the AND gate circuits 101 to 105.

The ring counter 8 produces at its other output terminals $Q_1$ and $Q_2$ signals $S_{21}$ and $S_{22}$ when the mark period $t_1$ begins and reaches 15 m sec, respectively. These signals $S_{21}$ and $S_{22}$ are fed to the set terminals S of flip-flop circuits 12 and 13 and the signal 22 is also fed to the reset terminal R of flip-flop circuit 12. The signal $S_{23}$ from the terminal $Q_3$ of ring counter 8 is fed to the reset terminal R of flip-flop circuit 13. Thus, the flip-flop circuit 12 is set at the beginning of mark period $t_1$ and then reset after 15 m sec, while the flip-flop circuit 13 is set after 15 m sec from the beginning of mark period $t_1$ and then reset after 30 m sec. After 30 m sec from the beginning of mark period $t_1$ both the flip-flop circuits 12 and 13 are reset.

The output signals from the flip-flop circuits 12 and 13 are fed to an OR circuit 14 whose output signal is fed to a NAND circuit 15 which is also supplied with the signal $S_b$ from the detector 3. The output signal from the NAND circuit 15 is applied to an AND circuit 16 which is also supplied with the signal $S_6$ from the ring counter 4. The output signal from the AND circuit 16 is fed to the reset terminal R of the flip-flop circuit 11.

According to the receiving circuit described above, when the mark period of the signal $S_a$ becomes longer than 30 m sec, the flip-flop circuit 11 is set with the output signal $S_{23}$ from the ring counter 8 thus making the AND gate circuits 101 to 105 conductive. Under the above condition, when the signal $S_a$ arrives at its space period $t_2$, the ring counter 4 is reset and the space period $t_2$ of signal $S_a$ is measured. In this case, if the space period $t_2$ is, for example, 5 m sec, the ring counter 4 produces the signals $S_1$ and $S_2$ sequentially in this order. Thus, the counters 71 and 72 count the signals $S_1$ and $S_2$ as "1", respectively, with the counter 71 being reset by the signal $S_2$ with the result that only the counter 72 remains with the counted value "1". If the above is repeated four times, the decoder 82 produces an output signal and hence the flip-flop circuit 92 is set. The output signal $S_{12}$ from the flip-flop circuit 92 is delivered through the AND gate circuit 102 to the output terminal 112. The above operation is carried out similarly for the other periods shown in the table II.

In the case that a signal with a period shorter than 30 m sec (noise) is received by the circuit described above, one of the output signals from the flip-flop circuits 12 and 13 is "1" at the time when the mark period $t_1$ is terminated and the output signal of OR circuit 14 is "1". While, the signal $S_b$ is "1" at this time, so that the output signal of NAND circuit 15 is "0" and thusly the flip-flop circuit 11 is reset. Thus the AND gate circuits 101 to 105 are made non-conductive to avoid erroneous operation caused by noise.

Further, when the space period $t_2$ exceeds the maximum set time period, the output signal $S_6$ from the ring counter 4 becomes "0" and thus, the flip-flop circuits 91 to 95 are all reset.

Thus, signals can be derived from the output terminals 111 to 115 in response to the length of space period $t_2$, and there is less chance for erroneous operation caused by noise.

It is not necessary that the AND gate circuits 101 to 105 be limited to the location shown in FIG. 2, but they can also be located, for example, between the detector 3 and the ring counter 4, clock pulse generator 5 and AND circuit 6. In the latter case, a single AND gate circuit may be enough.

Further, in the present invention it is possible to control both the length of space period $t_2$ and the length of mark period $t_1$.

If both the space and mark periods $t_2$ and $t_1$ are controlled as set forth just above, the length of the space period $t_2$ can be controlled as, for example, four steps and that of the mark period $t_1$ can be controlled as, for example, four steps. Thus, a total of 20 functions can be transmitted. In this case, the minimum detecting time period is $$t_1 (max) \times 4 + t_2 (max) \times 4 = 64 \times 4 + 12 \times 4 = 304 \text{ (m sec)}$$

which is about 0.3 sec.

Figure 4:
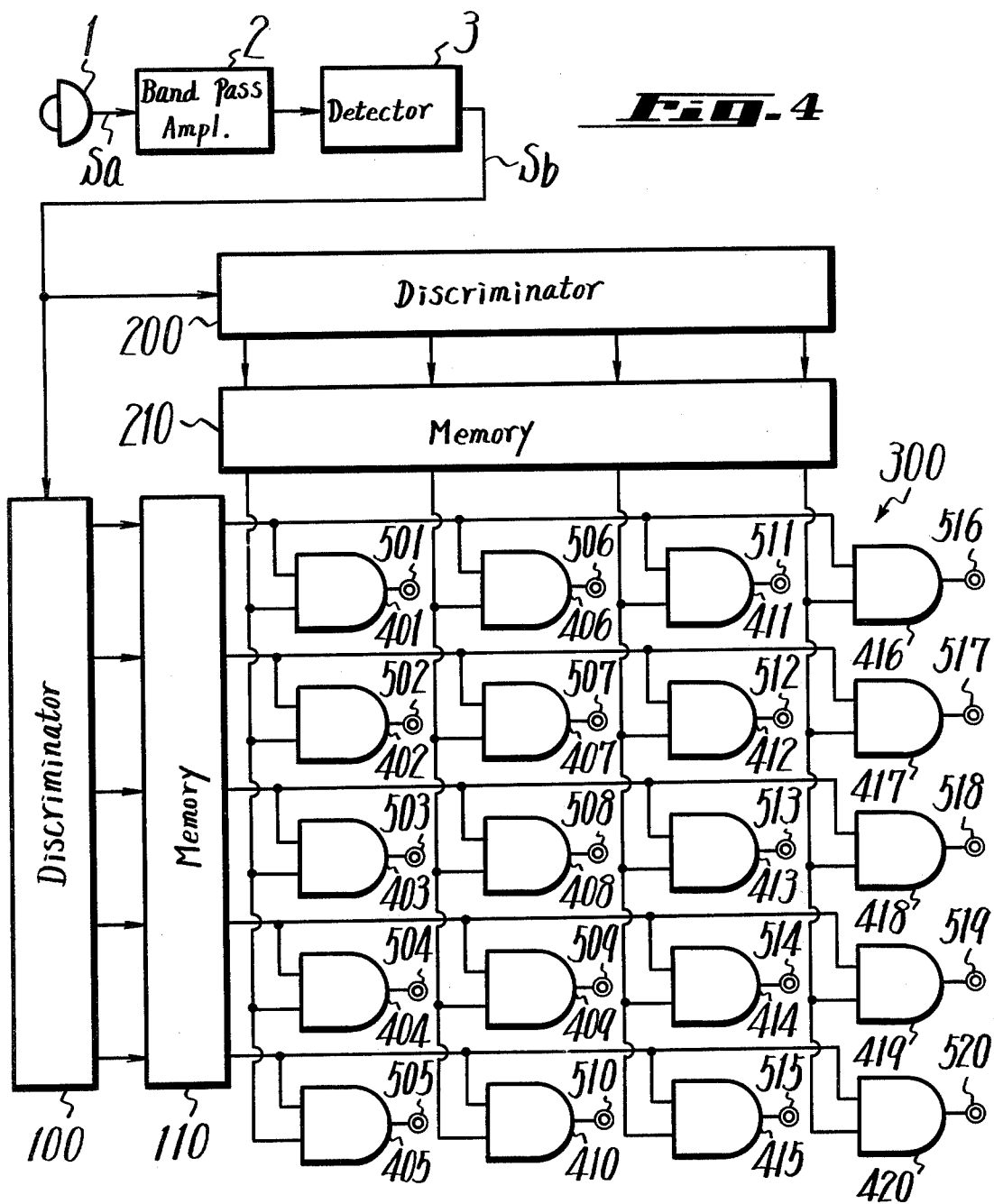
FIG. 4 is a schematic block diagram of another embodiment of the present invention.

FIG. 4 shows a block diagram of a receiver in which another embodiment of the present invention is employed for the purpose mentioned just above. In the example of FIG. 4, the signal $S_b$ from the detector 3 is fed to a discriminating circuit 100 which discriminates the space period $t_2$ and the output signal from the discriminating circuit 100 is fed through a memory circuit 110 to the row lines of a matrix circuit 300. Further, the signal $S_b$ is also fed to a discriminating circuit 200 which discriminates the mark period $t_1$ similarly to the prior art and the output signal from the discriminating circuit 200 is fed through a memory circuit 210 to the column lines of matrix circuit 300. The signals appearing at the respective intersecting points of matrix circuit 300 are fed to AND circuits 401 to 420, respectively.

With the circuit of the invention shown in FIG. 4, when the mark period $t_1$ and the space period $t_2$ become arbitrary values, the output signals corresponding thereto can be obtained from the AND circuits 401 to 420 at their output terminals 501 to 520, respectively.

In the present invention, the command signal is provided by making the ultrasonic wave signal intermittent, but it is possible to use an infrared signal in place of the ultrasonic wave signal.

While the preferred embodiments of the present invention are described above, it is to be understood that many modifications and variations could be effected by one skilled in the art without departing from the novel concepts of the present invention. Therefore, the scope of the appended claims should be interpreted accordingly.

We claim as our invention:

1. In a remote control system for selectively controlling a plurality of functions of an electrical apparatus, a receiver for receiving transmitted command signal comprised of a plurality of alternating mark periods and space periods between said mark periods, comprising;
   detector means for detecting each said space period;
   measuring means for measuring the length of said detected space period; and
   decoding means for selecting at least one of said functions in response to the detection of a plurality of space periods of substantially equal measured length.

2. A system according to claim 1, wherein said receiver further comprises
   a mark period detector, and
   an inhibiting means controlled by said mark period detector for inhibiting a function selection by said decoding means when a mark period of said command signal is shorter than a predetermined period.

3. A system according to claim 1, wherein said decoding means includes counting means responsive to said measured length for enabling a function selection after the receipt of a predetermined number of space periods each having substantially the same length.

4. A system according to claim 1, wherein said receiver further comprises means responsive to the lengths of said mark periods to enable said decoding means to determine the function to be selected.

5. In a remote control system for selectively controlling a plurality of functions of an electrical apparatus, a receiver for receiving a transmitted command signal comprised of a plurality of mark periods and at least one space period located between adjacent ones of said mark periods, comprising:
   detector means for detecting each said space period;
   measuring means for measuring the length of said detected space period, said measuring means including pulse generator means for generating pulses at a predetermined rate during each detected space period; and
   decoding means for selecting at least one of said functions in response to the measured length of said detected space period, said decoding means including a serial counter having a plurality of outputs which are energized serially and exclusively in response to pulses from said pulse generator means, each of said outputs corresponding to a respective one of said plurality of functions.

6. A system according to claim 5, wherein said receiver further comprises a plurality of second counting means each being connected to a respective one of said outputs of said serial counting means for enabling a function selection after the respective output of said serial counting means has been energized a predetermined number of times.

7. A system according to claim 6, wherein said receiver further comprises a plurality of memory means each being connected to a respective one of said second counting means for storing a signal indicating the selected function.

* * * * *